United States Patent [19]

Kanazawa

[11]  4,398,962
[45]  Aug. 16, 1983

[54] METHOD OF CONTROLLING BASE CONTACT REGIONS BY FORMING A BLOCKING LAYER CONTIGUOUS TO A DOPED POLY-SI EMITTER SOURCE

[75] Inventor: Mamoru Kanazawa, Yokohama, Japan

[73] Assignee: Tokyo Shibaura Denki Kabushiki Kaisha, Kawasaki, Japan

[21] Appl. No.: 306,223

[22] Filed: Sep. 28, 1981

[30] Foreign Application Priority Data

Sep. 26, 1980 [JP] Japan ................................ 55-132850

[51] Int. Cl.³ .................. H01L 21/263; H01L 21/225; H01L 21/20
[52] U.S. Cl. ..................................... 148/1.5; 148/187; 148/188; 156/643; 357/34; 357/91
[58] Field of Search ........................ 148/1.5, 188, 187; 156/643; 357/34, 91

[56] References Cited

U.S. PATENT DOCUMENTS

| 4,148,054 | 4/1979 | Hart et al. | 148/1.5 |
| 4,190,466 | 2/1980 | Bhattacharyya et al. | 148/1.5 |
| 4,209,350 | 6/1980 | Ho et al. | 148/188 |
| 4,211,582 | 7/1980 | Horng et al. | 148/1.5 |
| 4,234,362 | 11/1980 | Riseman | 148/187 |
| 4,243,435 | 1/1981 | Barile et al. | 148/1.5 |
| 4,279,671 | 7/1981 | Komatsu | 148/188 |
| 4,318,751 | 3/1982 | Horng | 148/1.5 |

FOREIGN PATENT DOCUMENTS 5391672 of 0000 Japan .
5444477 of 0000 Japan .

OTHER PUBLICATIONS

Technical Digest of 1979 International Electron Devices Meeting, Session 14.4, "An Advanced PSA Process for High Speed Bipolar VLSI"; Ishida et al. Dec. 1979.

Primary Examiner—Upendra Roy
Attorney, Agent, or Firm—Oblon, Fisher, Spivak, McClelland & Maier

[57] ABSTRACT

A method of manufacturing a semiconductor device includes a step of forming a film doped with an emitter impurity on a predetermined surface area of a semiconductor layer. An ion implantation blocking layer is formed to cover the top and side surfaces of the doped film and the exposed surface of the semiconductor layer. Then, the blocking layer is anisotropically etched by irradiating it with a dry etchant in a direction substantially normal to the semiconductor layer. The anisotropic etching is carried out until the top surface of the doped film is substantially exposed, thereby allowing a portion of the blocking layer to leave surrounding the doped film and also substantially forming a base contact hole defined by the exposed side surface of the remaining blocking layer. Subsequently, ion implantation is conducted against the semiconductor layer with the remaining blocking layer used as a mask, to form at least a base contact region of a high impurity concentration in a portion of the semiconductor layer corresponding to the base contact hole.

14 Claims, 7 Drawing Figures

METHOD OF CONTROLLING BASE CONTACT REGIONS BY FORMING A BLOCKING LAYER CONTIGUOUS TO A DOPED POLY-SI EMITTER SOURCE

BACKGROUND OF THE INVENTION

1. Field of the Invention

This invention relates to the manufacture of semiconductor devices and, more particularly, to a method of manufacturing integration semiconductor devices with high integration density and high precision.

2. Description of the Prior Art

To manufacture a semiconductor device such as a bipolar type high frequency transistor device, it has been the practice, for instance, to form an $n^+$-type buried layer 2 in a p-type silicon substrate 1 and epitaxially grow an n-type silicon layer 3 on the entire surface of the substrate 1, as shown in FIG. 1. Then, the epitaxial layer 3 is isolated into island regions by silicon oxide layers 4 formed by selective etching, followed by masked oxidation. Subsequently, phosphorus is diffused into the smaller island region to form a collector contact region 5. Then, a base active layer 6a is formed through ion implantation of boron into the larger island region, and a base contact region 6b of high impurity concentration is formed through diffusion of boron. Thereafter, a silicon oxide film 7 is formed, and contact holes 8 and 9 are formed for an emitter region and the collector contact region. The emitter region 11 is then formed by covering the emitter contact hole 8 with a patterned polycrystalline layer (hereinafter referred to as polysilicon layer) 10 doped with an impurity such as arsenic or phosphorus and diffusing the impurity into the epitaxial layer. A base contact hole 12 is formed, and, finally, electrodes 13 are formed to be electrically connected to each region through each contact hole.

In this prior art method, the emitter region 11 is formed after the formation of the base contact region 6b. In this case, the sole positioning of these regions requires two distinct steps and thus necessitates an allowance which is double the positioning allowance in each step. This is undesired from the standpoint of the higher density of integration.

Japanese Patent Disclosure No. 53-91672 discloses a method, in which the base contact region 6b is formed by ion implantation using, as a mask, the patterned polysilicon layer 10 which covers the emitter region contact hole 8 and extends over the silicon oxide film. However, again in this method the polysilicon film 10 which serves as a mask at the time of the ion implantation is patterned after the positioning of the emitter region (i.e., the positioning of the emitter region contact hole 8). Therefore, a similar allowance to that in the aforementioned prior art is necessary.

Japanese Patent Disclosure 54-20675 discloses a method, which makes use of a patterned laminated layer, which is formed over the eventual emitter region and consists of a silicon oxide film and a silicon nitride film formed thereon. This laminated layer is used as a mask for the ion implantation to form the base active layer 6a and base contact region 6b. The silicon layer is then thermally oxidized to form a silicon oxide layer. Then, the emitter region 11 is formed by removing the laminated film and doping an impurity from the exposed surface. With this method, the silicon layer immediately beneath the laminated layer is laterally oxidized in the thermal oxidation step, and the emitter region can thus be spaced apart from the base contact region to the extent corresponding to the oxidized portion of the silicon layer. However, the growth of the thermal oxide film, which is comparatively thick, strains the silicon layer and deteriorates the emitter junction characteristics. In addition, a positioning error of the base contact hole, which is formed afterwards, is inevitable.

SUMMARY OF THE INVENTION

Accordingly, an object of the invention is to provide a method of manufacturing semiconductor devices, which can achieve high integration density and high precision.

According to the invention, the above object and other objects which will become apparent hereinafter are attained by self-alignment techniques utilizing so-called anisotropic etching. More particularly, the method of manufacturing semiconductor devices according to the invention includes forming a film doped with an impurity for emitter on a predetermined surface area of a semiconductor layer. A layer of an ion implantation blocking material is then formed to cover the top and side surfaces of the doped film and the exposed surface of the semiconductor layer. Subsequently, the blocking layer is anisotropically etched by irradiating it with a dry etchant in a direction substantially normal to the semiconductor layer. The anisotropic etching is carried out until the top surface of the doped layer is substantially exposed. After this anisotropic etching, a portion of the blocking layer is left in the periphery of the doped film, and the base contact hole is substantially defined by the exposed side surfaces of the remaining blocking layer. This remaining blocking layer is used as a mask for ion implantation to form at least a base contact region of high impurity concentration in a portion of the semiconductor layer corresponding to the base contact hole.

The term "substantially expose" as used throughout the specification is intended to mean that a certain thickness of the blocking layer may be left on the doped film or on the semiconductor layer. More particularly, the blocking layer may slightly be left on the doped film or semiconductor layer provided the diameter of the base contact hole, which is substantially defined by the side surfaces of the residual blocking layer, is not substantially increased when the residual blocking layer is etched away with an isotropic etchant, i.e., an ordinary liquid etchant.

The term "dry etchant" is used as an antonym to the wet etchant or liquid etchant; it means a non-liquid etchant as is well known in the art and is inclusive of both reactive ions and inactive ions.

According to the invention, the emitter region may be formed by the diffuson of an impurity from the doped film into the semiconductor layer, and the distance between the emitter region and the base contact region can be regulated by the width of the residual blocking layer. Further, the width of the residual blocking layer is substantially the same as the thickness of the initial blocking layer formed on the doped film. Thus, by appropriately selecting the thickness of the initial blocking layer formed prior to etching, it is possible to set a desirable distance between the emitter region and base contact region. Further, the anisotropic etching has an effect of forming a self-aligned base contact hole. Thus, according to the invention it is possible to manufacture a high density semiconductor device with high precision.

DETAILED DESCRIPTION OF THE PREFERRED EMBODIMENTS

Figure 1:
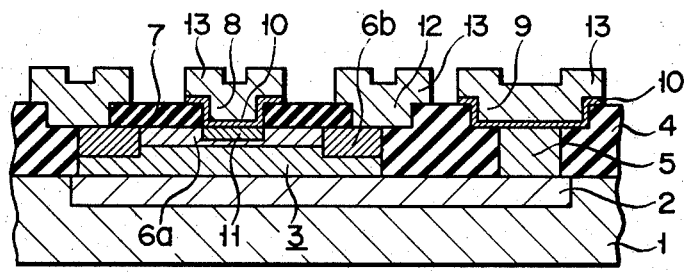
FIG. 1 is a sectional view for explaining a prior art method of manufacturing a semiconductor device.

Now, preferred embodiments of the invention will be described with reference to the drawings. In the Figures, like parts are designated by like reference numerals.

First, a method of manufacturing an npn bipolar transistor device will be described with reference to FIGS. 2A through 2E.

Figure 2A:
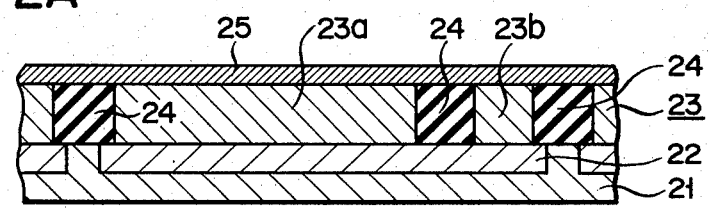
FIGS. 2A to 2E are sectional views of a semiconductor device according to the invention, illustrating how the device is manufactured.

As shown in FIG. 2A, in a p-type silicon substrate 21 with a resistivity of 18 to 25 $\Omega$.cm is formed an n+-type burried layer 22 with an impurity concentration of $1 \times 10^{20}$ to $3 \times 10^{20}$ cm$^{-3}$, and an n-type silicon layer 23 with an impurity concentration of $1.5 \times 10^{16}$ to $2.2 \times 10^{16}$ cm$^{-3}$ is epitaxially grown atop the entire wafer surface. Then, several island regions of various sizes, for instance a large island region 23a and a small island region 23b, are formed by separating the n-type silicon layer 23 with the formation of silicon oxide layers 24. The silicon oxide layers 24 can be formed by etching the silicon layer 23, followed by masked oxidation as is well known in the art. This silicon oxide layer 24 formed by oxidation actually projects slightly (usually by about 3,000 Å) around the boundary with the silicon layer 23, but the projecting porton is not shown for the simplicity of the description. The island region 23b is then doped with, for instance, phosphorus to a depth reaching the burried layer 22, thus forming an n+-type collector contact region. Then, a polycrystalline silicon layer 25 doped with, for instance, $1 \times 10^{20}$ to $2 \times 10^{20}$ cm$^{-3}$ of arsenic is formed by the chemical vapor deposition method (CVD method) on the surface of the silicon 23 including the oxide layer 24.

Figure 2B:
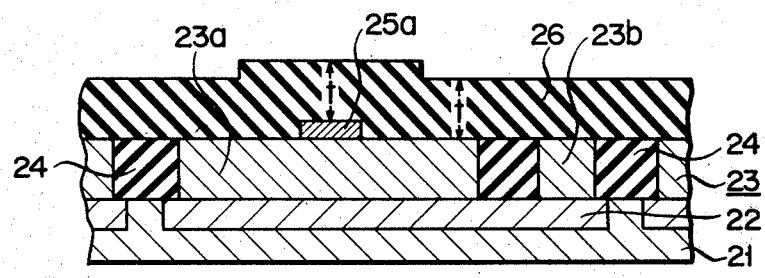

Subsequently, as shown in FIG. 2B, the doped polycrystalline silicon layer 25 is patterned by photoetching so that it is left only on a central portion of the island region 23a. Then, an ion implantation blocking layer 26, for instance a silicon oxide layer, is formed to a thickness of 1 to 1.2$\mu$ to entirely cover the remaining polycrystalline silicon layer 25a and the silicon layer 23 including the oxide layer 24. This ion implantation blocking layer 26 is capable of blocking ions at least to some extent at the time of subsequent ion implantation. This blocking layer may be formed of an insulating material such as silicon nitride ($Si_3N_4$) and glass, for instance, phosphosilicate glass, as well as silicon oxide mentioned above.

Figure 2C:
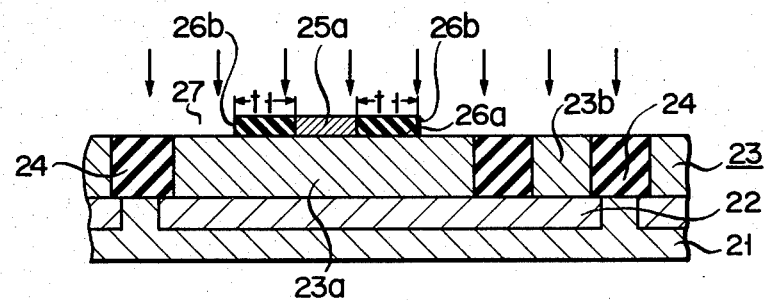

The blocking layer 26 is then anisotropically etched by irradiating it with a dry etchant in a direction substantially perpendicular to the silicon layer 23 as shown by arrow in FIG. 2C. In this step the blocking layer 26 is etched uniformly, keeping the profile of the layer 26 similar to the original profile, until the doped layer 25a is substantially exposed. The anisotropic etching can be done by using reactive ions; specifically silicon oxide may be etched by irradiating it with active ions generated from a mixture of carbon tetrafluoride ($CF_4$) and hydrogen ($H_2$) by glow discharge, and etching of silicon nitride may be conducted using ions similarly generated from a mixture of carbon monobromotrifluoride ($CBrF_3$) and chlorine ($Cl_2$). To achieve the etching a pair of parallel plate-like electrodes may be used, which are connected respectively to the ground and a high frequency voltage source. A wafer is put on the electrode connected to the voltage source, and the gas mixture is introduced into the space between the electrodes and a high frequency voltage is applied to the electrode. Alternatively, it is possible to use sputter etching process of irradiating with inactive gas ions. This etching can be carried out until the top surface of the doped layer 25a is completely exposed. In this case, a portion 26a of the blocking layer 26 is left to surround the doped layer 25a. The width $t_1$ of the remaining layer 26a is substantially equal to the thickness t of the blocking layer 26 on the doped layer 25a (FIG. 2B). Since the blocking layer 26 on the silicon layer 23 other than the portion 26a is completely removed, a base contact hole 27 is formed between the exposed side surfaces 26b of the remaining blocking layer 26a and the oxide layer 24.

However, it is preferable to etch the blocking layer 26 by the anisotropic etching such that it is left with a slight thickness (for instance about 120 Å) on the doped layer 16a and hence on the silicon layer 23. Generally, etching with a reactive etchant results in the formation of a polymer film having an uncertain composition due to the action of the reactive ions on the finally exposed silicon. This polymer film is difficult to remove for exposing the silicon surface. By leaving a very thin blocking layer (which can be readily removed by wet etching) on the silicon layer 23 as mentioned above, the formation of the aforementioned polymer film can be prevented. Even in this case, the base contact hole is substantially formed.

As mentioned earlier, the width $t_1$ of the remaining blocking layer 26a is determined absolutely by the thickness t of the blocking layer 26. This is very convenient in that the distance between a base contact egion 28a (FIG. 2D) that is subsequently formed through the contact hole 27 and an emitter region (FIG. 2D) formed through impurity diffusion from the doped layer 25a, can be determined by the thickness t of the initial blocking layer 26 and without requiring any mask alignment.

Figure 2D:
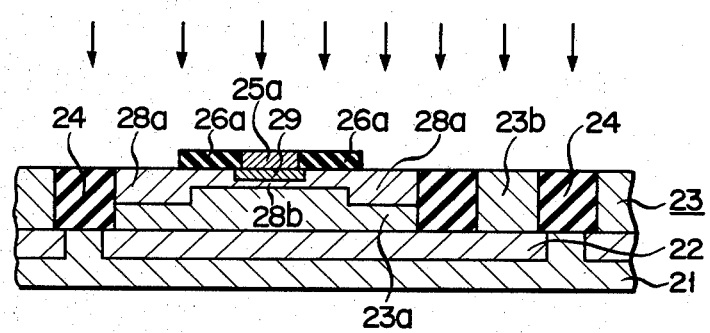

Subsequently, as shown in FIG. 2D, a base active region 28b and the base contact region 28a are simultaneously formed through implantation of, for instance, boron ions in the direction shown by arrows at an accelerating voltage of 70 kV and a dose of $1 \times 10^{15}$/cm$^2$. Immediately after the ion implantation, the surface impurity concentration $N_s$ of the base active region 28b is $5.5 \times 10^{18}$ to $6.7 \times 10^{18}$ cm$^{-3}$, while the maximum internal impurity concentration $N_p$ of the base contact region 28a is $5.4 \times 10^{19}$ to $6.6 \times 10^{19}$ cm$^{-3}$. The wafer is then heated in an inert gas atmosphere, e.g. nitrogen gas atmosphere, at about 1,000° C. for about 20 minutes. During the heat treatment an emitter region 29 is formed as the impurity diffuses from the doped region 25. At the same time the ion implanted regions are annealed. After the heat treatment, the base active region 28b has a surface impurity concentration $N_s$ of $2.9 \times 10^{18}$ to $3.5 \times 10^{18}$ cm$^{-3}$ (p-type region), a sheet resistance of 1.8 to 2.2 k$\Omega$/□ and a depth of 0.2 to 0.25$\mu$, while the base contact region 28b has a surface impurity concentration of $1.1 \times 10^{19}$ to $1.3 \times 10^{19}$ cm$^{-3}$ (p+-type region), a sheet resistance of 90 to 110 Ω/□ and a depth of 0.65 to 0.8μ.

Figure 2E:
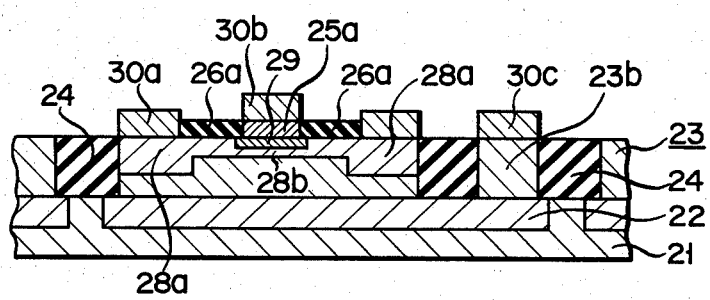

Finally, the surface of the base contact region 28a is cleaned by wet etching using a liquid etchant, followed by formation of a metal film, for instance an aluminum film, to cover the entire wafer surface and patterning this metal film to form a base electrode 30a, an emitter electrode 30b and a collector electrode 30c (FIG. 2E). If the blocking layer 26 is slightly left on the silicon layer 23 and doped layer 25a after its anisotropic etching described before in connection with FIG. 2C, the remaining blocking layer is removed by the aforementioned wet etching.

While in the example described above in connection with FIGS. 2A through 2E the ion implantation has been done after the anisotropic etching, it is also possible to carry out anisotropic etching after ion implantation. Alternatively, the anisotropic etching may be stopped when the blocking layer 26 is etched to some extent, then ion implantation may be carried out, and the anisotropic etching is restarted to be completed.

Figure 3:
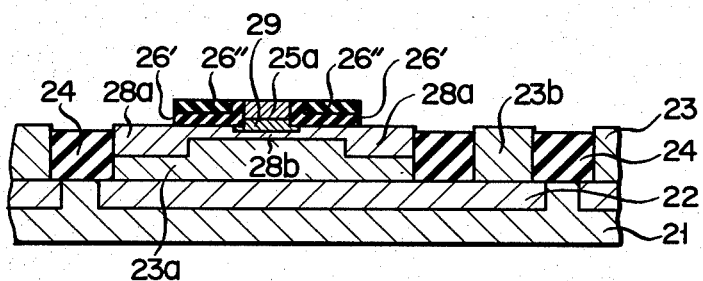
FIG. 3 is a sectional view illustrating another embodiment of the invention.

In a different embodiment of the invention, the whole wafer obtained by forming the polysilicon layer 25a on the silicon layer 23 is subjected to thermal oxidation to form an oxide layer 26' (FIG. 3), for instance with a thickness of 0.1 to 0.3μ, covering the silicon layer 23 and polysilicon layer 25a, and then a silicon oxide layer 26" is formed up to a predetermined thickness by the CVD method. Thereafter, the steps shown in FIGS. 2C through 2E are carried out to obtain a semiconductor device. Although the silicon oxide layer formed by the CVD method may deteriorate the boundary face with silicon, the thermal oxide film is free from such deterioration and thus permits obtaining a semiconductor device having superior performance. FIG. 3 is a sectional view of the device obtained by such method immediately before the formation of the electrodes (corresponding to FIG. 2D).

Further, the formation of the blocking layer and the etching with an ion etchant may be repeated to increase the blocking layer width at the side of the doped film. Further, the base active region and base contact region may be separately formed; for example, ion implantation of boron into the entire island region 23a (formation of the base active region) may be done prior to the formation of polysilicon, and subsequently ion implantation and heat treatment may be carried out to form the base contact region 29a in the step of FIG. 2B or 2D.

As has been described in the foregoing, according to the invention the base contact region of a high impurity concentration may be formed at a location close to the emitter region without the possibility of adversely affecting the emitter-base capacitance and breakdown voltage (base-emitter reverse breakdown voltage). Also, the construction may have low base resistance and is effective for increasing the integration density. Further, the increase of the integration density may be further promoted because the base contact hole can be self-aligned using the thickness of the initial blocking lays.

While the preceding examples have concerned with npn transistors, the invention can of course be applied to pnp transistors as well.

What is claimed is:

1. A method of manufacturing a semiconductor device comprising the steps in the following order of:
   (a) forming a film doped with an emitter impurity on a predetermined surface area of a semiconductor layer which surface area constitutes an island region isolated by an insulating layer;
   (b) forming an ion implantation blocking layer covering said doped film and the exposed surface of said semiconductor layer;
   (c) anisotropically etching said blocking layer until the surface of said doped film is substantially exposed, by irradiating said blocking layer with a dry etchant in a direction substantially normal to said semiconductor layer, thereby allowing a portion of said blocking layer to remain surrounding said doped film and substantially forming a base contact hole defined between the exposed side surfaces of said remaining blocking layer and said insulating layer;
   (d) conducting ion implantation with respect to said semiconductor layer, with said remaining blocking layer and said doped film used as a mask, to form at least a base contact region of a high impurity concentration in a portion of said semiconductor layer corresponding to said base contact hole; and
   (e) forming an emitter region in said semiconductor layer by diffusing the impurity from said doped film into said semiconductor layer by a thermal treatment.

2. The method according to claim 1, wherein said anisotropic etching is carried out until the surface of said doped film is completely exposed.

3. The method according to claim 1, wherein said anisotropic etching is carried out such that said blocking layer is slightly left also on said doped film and said semiconductor layer.

4. The method according to claim 1, wherein said blocking layer is formed of silicon oxide, silicon nitride or glass.

5. The method according to claim 1, wherein said semiconductor layer is formed of silicon.

6. The method according to claim 1, wherein said doped film comprises polycrystalline silicon.

7. The method according to claim 1, wherein said blocking layer comprises a thermal oxide film and a chemical vapor deposition film formed thereon.

8. The method according to claim 1, wherein said dry etchant is a reactive ion etchant or an inactive ion etchant.

9. The method according to claim 1, further comprising forming a base active region in said semiconductor layer under said remaining blocking layer and slaid doped film by said ion implantation during step (d).

10. The method according to claim 1, further comprising forming, before step (a), a base active region in said semiconductor layer by ion implantation.

11. The method according to claim 3, wherein the slightly remaining blocking layer on said doped film and said semiconductor layer is removed by wet etching after said ion implantation step (d).

12. The method according to claim 8, wherein said reactive ion etchant is derived from a mixture of carbon tetrafluoride and hydrogen through glow discharge.

13. The method according to claim 8, wherein said reactive ion etchant is derived from a mixture of carbon monobromotrifluoride and chlorine through glow discharge.

14. A method of manufacturing a semiconductor device comprising the steps of the following order of:
   (a) forming a film doped with an emitter impurity on a predetermined surface area of a semiconductor layer which surface area constitutes an island region isolated by an insulating layer;

(b) forming an ion implantation blocking layer covering said dope film and the exposed surface of said semiconductor layer;

(c) anisotropically etching said portion of said blocking layer by irradiating said blocking layer with a dry etchant in a direction substantially normal to said semiconductor layer, thereby allowing a portion of said blocking layer to remain surrounding said doped film and substantially forming a base contact hole defined between the exposed side surfaces of said remaining blocking layer and said insulating layer;

(d) conducing ion implantation with respect to said semiconductor layer, with said remaining blocking layer and said doped film used as a mask, to form at least a base contact region of a high impurity concentration in a portion of said semiconductor layer corresponding to said base contact hole;

(e) anisotropically etching the remainder of said blocking layer in the manner of step (c) until the surface of said doped film is substantially exposed; and (f) forming an emitter region in said semiconductor layer by diffusing the impurity from said doped film into said semiconductor layer by a thermal treatment.

* * * * *